(12) United States Patent
Wang et al.

(10) Patent No.: US 9,717,143 B2
(45) Date of Patent: Jul. 25, 2017

(54) METHOD FOR FABRICATING FLEXIBLE SUBSTRATE AND FLEXIBLE SUBSTRATE PREFABRICATED COMPONENT

(71) Applicant: BOE TECHNOLOGY GROUP CO., LTD., Beijing (CN)

(72) Inventors: Meili Wang, Beijing (CN); Hongda Sun, Beijing (CN); Fengjuan Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 478 days.

(21) Appl. No.: 14/353,389

(22) PCT Filed: Dec. 12, 2013

(86) PCT No.: PCT/CN2013/089310
§ 371 (c)(1),
(2) Date: Apr. 22, 2014

(87) PCT Pub. No.: WO2015/039391
PCT Pub. Date: Mar. 26, 2015

(65) Prior Publication Data
US 2016/0262256 A1    Sep. 8, 2016

(30) Foreign Application Priority Data

Sep. 22, 2013 (CN) .......................... 2013 1 0432558

(51) Int. Cl.
H05K 3/02    (2006.01)
H05K 3/46    (2006.01)
H05K 1/02    (2006.01)
H01L 23/00   (2006.01)
H01L 21/48   (2006.01)
H05K 1/03    (2006.01)

(52) U.S. Cl.
CPC ......... H05K 1/028 (2013.01); H01L 21/4846 (2013.01); H01L 23/00 (2013.01);
(Continued)

(58) Field of Classification Search
CPC ................ H05K 3/022; H05K 3/4644; H05K 2203/068; Y10T 156/1057; Y10T 156/1082
See application file for complete search history.

(56) References Cited

U.S. PATENT DOCUMENTS 8,147,640 B2    4/2012  Seo et al.
8,323,066 B2 *  12/2012  Kim ...................... G02F 1/1303
                                                    156/156
(Continued)

FOREIGN PATENT DOCUMENTS

CN    1862329 A    11/2006
CN    101877319 A    11/2010
(Continued)

OTHER PUBLICATIONS

English Translation of the International Search Report of PCT/CN2013/089310 published in English on Mar. 26, 2015.
(Continued)

*Primary Examiner* — Mark A Osele
*Assistant Examiner* — Christopher C Caillouet
(74) *Attorney, Agent, or Firm* — Collard & Roe, P.C.

(57) ABSTRACT

A method for fabricating a flexible substrate and a flexible substrate prefabricated component are disclosed, the flexible substrate comprises an electronic device and a flexible layer provided with the electronic device. The fabrication method comprises: disposing a single-sided adhesive layer at a central portion of a surface of a support substrate, an adhesive side of the single-sided adhesive layer being in contact with the support substrate; disposing a double-sided adhesive layer at a peripheral region of the support substrate; disposing the flexible layer on surfaces of the single-sided adhesive layer and the double-sided adhesive layer, the flexible layer being bonded to the double-sided adhesive layer; disposing the electronic device in a region of a surface
(Continued)

of the flexible layer corresponding to the single-sided adhesive layer; cutting the flexible layer along a boundary of the electronic device and removing the flexible layer from the single-sided adhesive layer.

18 Claims, 2 Drawing Sheets

(52) U.S. Cl.
CPC ........... *H05K 3/022* (2013.01); *H05K 3/4644* (2013.01); *H01L 2924/0002* (2013.01); *H05K 1/0393* (2013.01); *H05K 2201/0195* (2013.01); *H05K 2203/0235* (2013.01); *H05K 2203/068* (2013.01)

(56) References Cited

U.S. PATENT DOCUMENTS

| | | | |
|---|---|---|---|
| 2006/0254704 A1 | 11/2006 | Seo et al. | |
| 2011/0227848 A1* | 9/2011 | Furusawa | G06F 1/1626 345/173 |
| 2015/0075705 A1 | 3/2015 | Qiao et al. | |

FOREIGN PATENT DOCUMENTS

| | | |
|---|---|---|
| CN | 102810512 A | 12/2012 |
| CN | 103257472 A | 8/2013 |
| CN | 203521391 U | 4/2014 |
| JP | 2009004603 A | 1/2009 |

OTHER PUBLICATIONS

Chinese Office Action in Chinese Application No. 201310432558.2, mailed Sep. 29, 2016 with English translation.

Written Opinion of the International Searching Authority of PCT/CN2013/089310, mailed Jun. 30, 2014 (English Translation).

International Search Report, International Preliminary Report on Patentability and Written Opinion of the International Searching Authority of PCT/CN2013/089310 in Chinese, mailed Jun. 30, 2014.

Second Chinese Office Action in Chinese Application No. 201310432558.2, mailed Apr. 19, 2017 with English translation.

* cited by examiner

METHOD FOR FABRICATING FLEXIBLE SUBSTRATE AND FLEXIBLE SUBSTRATE PREFABRICATED COMPONENT

CROSS REFERENCE TO RELATED APPLICATIONS

This application is the National Stage of PCT/CN2013/089310 filed on Dec. 12, 2013, which claims priority under 35 U.S.C. §119 of Chinese Application No. 201310432558.2 filed on Sep. 22, 2013, the disclosure of which is incorporated by reference. The international application under PCT article 21(2) was not published in English.

FIELD OF THE ART

Embodiments of the invention relate to the field of display technologies, more particularly, to a method for fabricating a flexible substrate and a flexible substrate prefabricated component.

BACKGROUND

Currently, two methods are mainly used to fabricate flexible substrates. The first one is a roll-to-roll method, in which electronic devices are disposed on a flexible layer directly via printing to create a flexible substrate. However, as the conventional printing technology is not sophisticated enough, it can only be used to fabricate products having relatively low precision requirement, with the non-defective rate being low and product quality being poor. A second method is the currently very popular "attach and remove" method, according to which, a flexible layer is attached onto a hard substrate via an adhesive layer, a high-power laser beam is used to scan the back surface of the hard substrate after disposing electronic devices on the flexible layer, ageing the adhesive layer to peel the flexible layer from the hard substrate, thereby obtaining a flexible substrate provided with the electronic devices. However, such a method requires scanning with the high-power laser beam, the production efficiency is low and the production cost is high; moreover, the peeling is of poor uniformity, which can easily cause residuals at the back surface of the flexible layer.

SUMMARY

In view of the above, an objective of the invention is to provide a method for fabricating a flexible substrate and a flexible substrate prefabricated component, so as to fabricate products having high precision requirements and evenly peel the flexible layer off, such that residuals at the back surface of the flexible layer can be avoided and the production cost can be reduced.

To achieve the above objective, technical solutions of the invention are realized with the following implementations.

A first aspect of the invention provides a method for fabricating a flexible substrate, the flexible substrate comprises an electronic device and a flexible layer provided with the electronic device, the method comprises:

disposing a single-sided adhesive layer at a central portion of a surface of a support substrate, an adhesive side of the single-sided adhesive layer being in contact with the support substrate;

disposing a double-sided adhesive layer at a peripheral region of the support substrate;

disposing the flexible layer on surfaces of the single-sided adhesive layer and the double-sided adhesive layer, the flexible layer being bonded to the double-sided adhesive layer;

disposing the electronic device in a region of the surface of the flexible layer corresponding to the single-sided adhesive layer;

cutting the flexible layer along a boundary of the electronic device and removing the flexible layer from the single-sided adhesive layer.

As an example, the single-sided adhesive layer, the double-sided adhesive layer and the flexible layer are disposed by way of coating or bonding.

As an example, the double-sided adhesive layer is disposed at all or a part of the peripheral region of the support substrate when disposing the double-sided adhesive layer.

As an example, it cuts to the surface of the single-sided adhesive layer when cutting the flexible layer.

As an example, holes configured for adsorbing the flexible layer are disposed on a non-adhesive side of the single-sided adhesive layer.

As an example, a diameter of the holes ranges from 1 micrometer to 100 micrometers.

As an example, a thickness of the double-sided adhesive layer is the same as that of the single-sided adhesive layer.

As an example, the single-sided adhesive layer is in contact with and shape-match with the double-sided adhesive layer.

A second aspect of the invention provides a flexible substrate prefabricated component comprising a flexible substrate, the flexible substrate comprises an electronic device and a flexible layer provided with the electronic device; the flexible substrate prefabricated component further comprises a support substrate, double-sided adhesive layer and a single-sided adhesive layer, wherein:

the single-sided adhesive layer is disposed at a central portion of a surface of the support substrate, the double-sided adhesive layer are disposed at a peripheral region of the support substrate; the flexible layer is disposed on surfaces of the single-sided adhesive layer and the double-sided adhesive layer, the flexible layer is boned to the double-sided adhesive layer, and the electronic device is disposed in a region of the single-sided adhesive layer.

As an example, the single-sided adhesive layer, the double-sided adhesive layer and the flexible layer are disposed by way of coating or bonding.

As an example, the double-sided adhesive layer are disposed at all or a part of the peripheral region of the support substrate.

As an example, holes configured for adsorbing the flexible layer are disposed on a non-adhesive side of the single-sided adhesive layer.

As an example, a diameter of the holes ranges from 1 micrometer to 100 micrometers.

As an example, a thickness of the double-sided adhesive layer is the same as that of the single-sided adhesive layer.

As an example, the single-sided adhesive layer is in contact with and shape-match with the double-sided adhesive layer.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not limitative of the invention.

FIG. 1 schematically illustrates a configuration of a flexible substrate prefabricated component in accordance with an embodiment of the invention.

NUMERAL REFERENCE 1. support substrate; 2. single-sided adhesive layer; 3. double-sided adhesive layer; 4. flexible layer; 5. electronic device.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
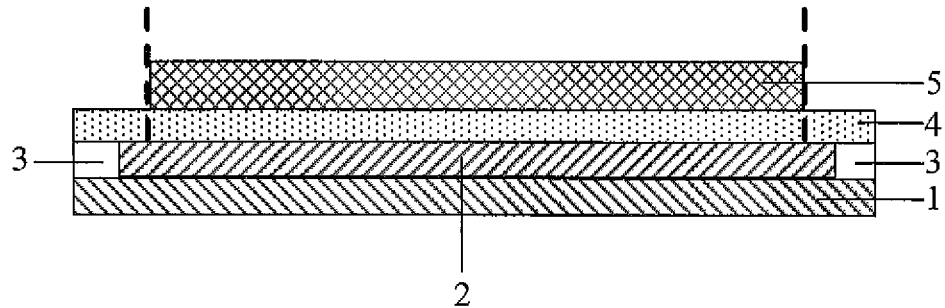

With reference to FIG. 1, a configuration of a flexible substrate prefabricated component in accordance with an embodiment of the invention is illustrated. When fabricating the flexible substrate, a single-sided adhesive layer 2 may be disposed on a central portion of a surface of a support substrate 1, making an adhesive side of the single-sided adhesive layer 2 contact the support substrate 1. A double-sided adhesive layer 3 is further disposed in peripheral region of the support substrate 1, and the double-sided adhesive layer 3 may be disposed in all or a part of the peripheral region of the support substrate 1. As an example, a thickness of the double-sided adhesive layer 3 is the same as that of the single-sided adhesive layer 2. A flexible layer 4 is disposed on surfaces of the single-sided adhesive layer 2 and the double-sided adhesive layer 3. An electronic device 5 is disposed on a surface of the flexible layer, the electronic device 5 is disposed in a region of the single-sided adhesive layer 2, that is, an area of the electronic device 5 is smaller than or equal to that of the single-sided adhesive layer 2. After finishing disposing the electronic device 5, the flexible layer 4 is cut along a boundary of the electronic device 5 (cut position indicated by the dotted line in the drawing). As no adhesion exists between the flexible layer 4 and the single-sided adhesive layer 2, the flexible layer 4 provided with the electronic device 5 can be easily removed from the single-sided adhesive layer 2 to obtain a flexible substrate, that is, the flexible layer 4 provided with the electronic device 5.

Herein, the electronic device comprises some packaged elements and components. Specifically, the electronic device may comprise a Thin Film Transistors (TFT), a pixel electrode, a liquid crystal layer and an organic light emitting layer and the like. The electronic device of the invention is substantially the same as those in conventional LCD or OLED display device and will not be elaborated here. The above single-sided adhesive layer, the double-sided adhesive layer and the flexible layer may be fabricated by directly coating their respective materials. It may also fabricate the single-sided adhesive layer, the double-sided adhesive layer and the flexible layer first and then bond respective layers together. The above disposition method will not be defined by the invention.

It is noted that an operation of disposing the single-sided adhesive layer 2 and an operation of disposing the double-sided adhesive layer 3 may be performed at the same time. Alternatively, the single-sided adhesive layer 2 may be disposed first, and then the double-sided adhesive layer 3 is disposed. It may also dispose the double-sided adhesive layer 3 first and then the single-sided adhesive layer 2. Furthermore, when cutting the flexible layer 4 along a boundary of the electronic device 5, it may cut to the single-sided adhesive layer 2 or the support substrate 1. For example, it may cut to the surface of the support substrate 1 along a boundary of the electronic device 5. The boundary of the electronic device 5 is a boundary encompassing all the electronic devices. It can be contemplated that it may be appropriately expanded outwardly to include a region of the flexible layer not having the electronic devices, based on a size of the flexible substrate or design requirements.

It is further noted that the peripheral region as used in the invention refers to a portion surrounding the central portion, such as a region surrounding the central portion of the support substrate. The peripheral region may be covered all by the double-sided adhesive layer, or may be covered by the double-sided adhesive layer at several spots in the region. As an example, the entire region is covered by the double-sided adhesive layer, such that the flexible layer is attached more firmly. Furthermore, it may also dispose the double-sided adhesive layer 3 at the peripheral region of the surface of the support substrate 1. It may also dispose the double-sided adhesive layer 3 at side surfaces of the support substrate 1, as long as the double-sided adhesive layer 3 can secure the flexible layer 4. As an example, the double-sided adhesive layer covers the entire peripheral region of the surface of the support substrate 1, which may render the surface on which the flexible layer will be fixed more stable and flat, because covering the entire region is uniform and continuous in comparison with covering only part of the region.

It is seen that by disposing the single-sided adhesive layer 2 at the central portion of the support substrate 1 and the double-sided adhesive layer 3 at the peripheral region, the flexible layer 4 is fixed on the adhesive layers and the flatness of the flexible layer 4 can be kept, which is beneficial for the precise alignment of the electronic device 5 on the flexible layer 4. Moreover, an area of the electronic device 5 arranged on the flexible layer 4 is smaller than or equal to that of the single-sided adhesive layer 2. Upon finishing disposing the electronic device 5, the flexible layer 4 is cut along a boundary of the electronic device 5. As the adhesive side of the single-sided adhesive layer 2 is in contact with the support substrate 1 and no adhesion exists between the single-sided adhesive layer 2 and the flexible layer 4, the flexible layer 4 provided with the electronic device 5 can be easily removed from the single-sided adhesive layer 2 after being cut, thereby effectively preventing any residuals on the back surface of the flexible layer 4. Moreover, no high-power laser beam is required for the peeling, which may help to reduce the production cost.

Figure 2:
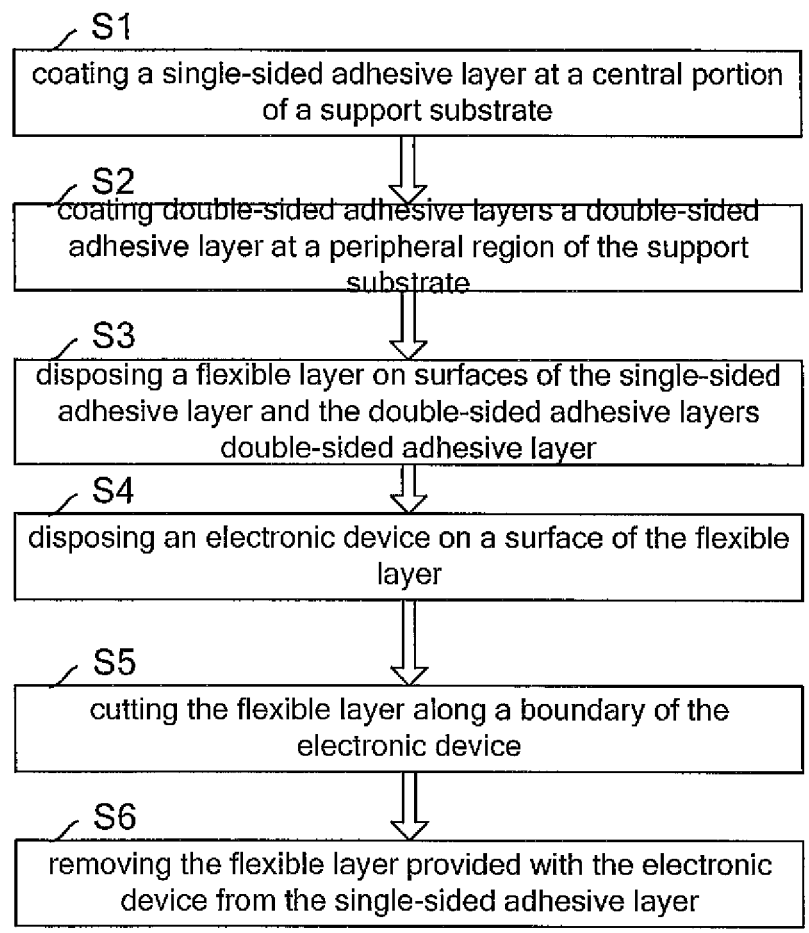
FIG. 2 illustrates a flow chart of a method for fabricating a flexible substrate in accordance with an embodiment of the invention.
Figure 3:
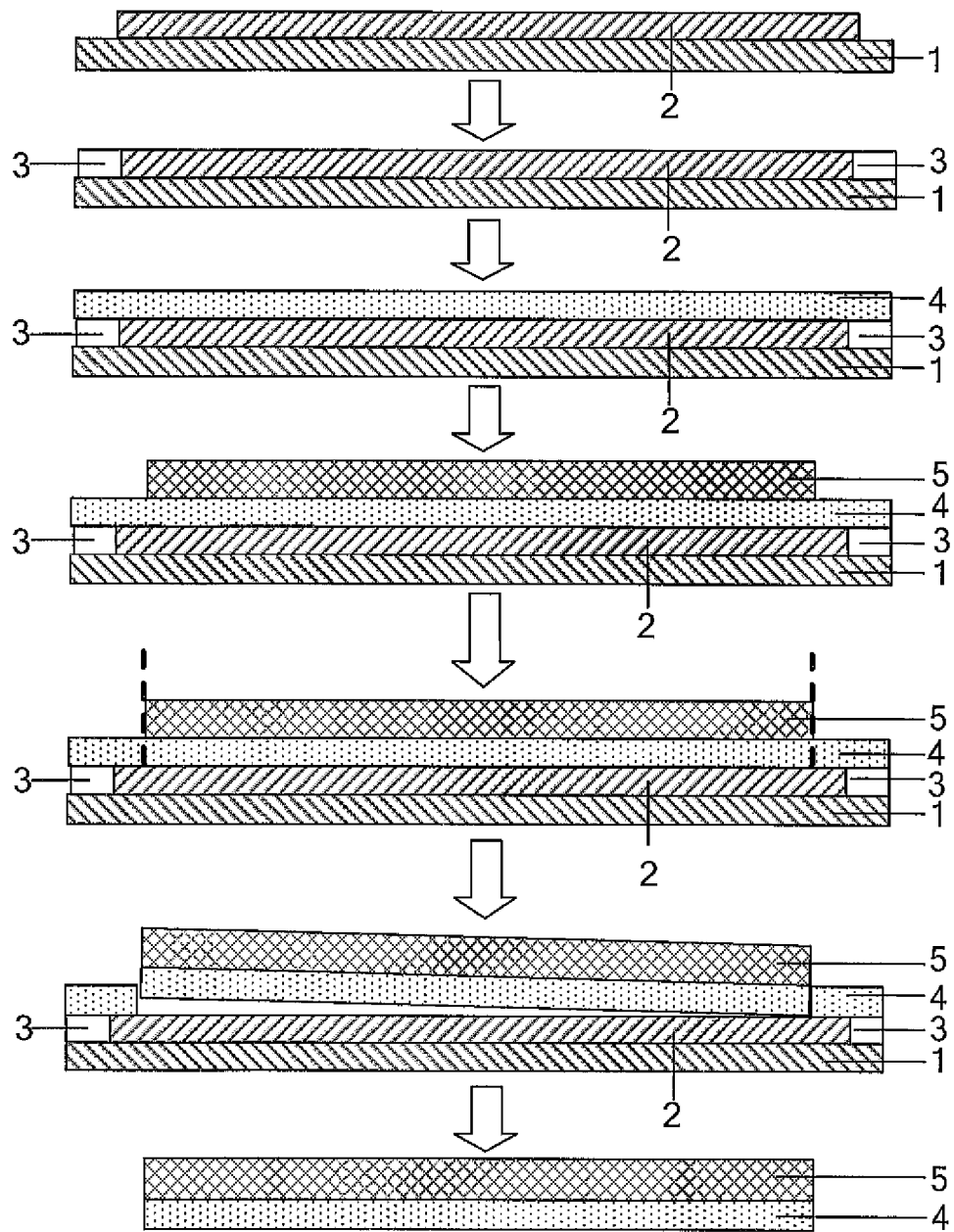
FIG. 3 schematically illustrates a fabrication process for a flexible substrate in accordance with an embodiment of the invention.

With reference to FIGS. 2 and 3, a flow chart of a method for fabricating a flexible substrate provided by the embodiment of the invention and a schematic fabrication process for the flexible substrate are illustrated. In the following, the embodiment of the invention will be described in detail in connection with FIGS. 2 and 3.

The method for fabricating the flexible substrate may comprise the following steps:

S1: disposing a single-sided adhesive layer 2 on a central portion of a support substrate 1, a side of the single-sided adhesive layer 2 in contact with the support substrate 1 is adhesive, and a side in contact with the flexible layer 4 is non-adhesive; the support substrate 1 and the single-sided adhesive layer 2 are configured for supporting and fixing the flexible layer 4, making the flexible layer 4 flat and guaranteeing the precise alignment of the electronic device 5.

S2: disposing a double-sided adhesive layer 3 at, all or a part of, peripheral region of the support substrate 1. The double-sided adhesive layer 3 is disposed to fix the flexible layer 4. A thickness of the double-sided adhesive layer 3 may be the same as or different than that of the single-sided adhesive layer 2. As an example, the thickness of the double-sided adhesive layer 3 is the same as that of the single-sided adhesive layer 2 to ensure the flatness of the flexible layer 4.

S3: disposing a flexible layer 4 on surfaces of the single-sided adhesive layer 2 and the double-sided adhesive layer 3, the flexible layer 4 being in contact with the double-sided adhesive layer 3.

As an example, an area of the flexible layer 4 is larger than that of the single-sided adhesive layer 2 and it is ensured that the flexible layer 4 can overlay the double-sided adhesive layer 3 such that the flexible layer 4 is fixed by the double-sided adhesive layer 3.

S4: disposing the electronic device 5 in a region of the surface of the flexible layer 4 corresponding to the single-sided adhesive layer 2.

As an example, after the flexible layer 4 is dried (to remove the solvent therein) and fixed on the double-sided adhesive layer 3, the electronic device 5 is disposed on the surface of the flexible layer 4. An area of the electronic device 5 is smaller than or equal to that of the single-sided adhesive layer 2, to facilitate the subsequent cut and peeling of the flexible layer 4.

S5: cutting the flexible layer 4 along a boundary of the electronic device 5 and removing the flexible layer 4 from the single-sided adhesive layer 2, upon finishing disposing the electronic device 5.

For example, it cuts towards the support substrate 1 till the surface of the single-sided adhesive layer 2 along a boundary of the electronic device (cut position indicated by the dotted line in the drawing). It can be contemplated that it may also cut to the surface of the support substrate 1. In consideration of reusing the single-sided adhesive layer, as an example, it may cut to the surface of the single-sided adhesive layer 2.

S6: removing the flexible layer 4 provided with the electronic device 5 from the single-sided adhesive layer 2 to get the flexible substrate. As no adhesion exists between the flexible layer 4 and the single-sided adhesive layer 2, the flexible layer 4 can be easily peeled after cutting.

As an example, holes may also be disposed on a non-adhesive side of the single-sided adhesive layer 2 for adsorbing the flexible layer 4. For example, a diameter of the holes may range from 1 micrometer to 100 micrometers. If the holes are too small, for example less than 1 micrometer, there is hardly any absorption effect. On the other hand, if the holes are too large, for example larger than 100 micrometers, it may adversely affect the flatness of the flexible layer.

Furthermore, as an example, the single-sided adhesive layer 2 is in a state of contacting with the double-sided adhesive layer 3 and shape-matching with the double-sided adhesive layer 3. Shape-matching means the two layers have completely matching shapes at the joining part. That is, the single-sided adhesive layer 2 and the double-sided adhesive layer 3 are seamlessly and tightly in contact with each other, such that the flatness of the flexible layer 4 is well maintained. It can be contemplated that the single-sided adhesive layer 2 and the double-sided adhesive layer 3 may be separated from each other. As long as the flatness of the flexible layer 4 is not compromised, the single-sided adhesive layer 2 and the double-sided adhesive layer 3 can be in contact with each other or not.

It is seen that the method and the flexible substrate prefabricated component provided by the embodiment of the invention can fix the flexible substrate and maintain its flatness, which is advantageous for the accurate alignment of the electronic device. The flexible layer can be evenly peeled, with no residuals at the back surface of the flexible layer. Moreover, no high-power laser beam is required for the peeling, thereby reducing the production cost.

What are described above is related to the illustrative embodiments of the disclosure only and not limitative to the scope of the disclosure; the scopes of the disclosure are defined by the accompanying claims.

What is claimed is:

1. A method for fabricating a flexible substrate, the flexible substrate comprising an electronic device and a flexible layer provided with the electronic device, the method comprising:
    disposing a single-sided adhesive layer at a central portion of a surface of a support substrate, an adhesive side of the single-sided adhesive layer being in contact with the support substrate;
    disposing a double-sided adhesive layer at a peripheral region of the support substrate;
    disposing the flexible layer on surfaces of the single-sided adhesive layer and the double-sided adhesive layer, the flexible layer being bonded to the double-sided adhesive layer;
    disposing the electronic device in a region of a surface of the flexible layer corresponding to the single-sided adhesive layer;
    cutting the flexible layer along a boundary of the electronic device and removing the flexible layer from the single-sided adhesive layer;
    wherein the single-sided adhesive layer is in contact with and shape-match with the double-sided adhesive layer.

2. The method of claim 1, wherein the single-sided adhesive layer, the double-sided adhesive layer and the flexible layer are disposed by way of coating or bonding.

3. The method of claim 2, wherein the double-sided adhesive layer is disposed at all or a part of the peripheral region of the support substrate when disposing the double-sided adhesive layer.

4. The method of claim 2, wherein holes configured for adsorbing the flexible layer are disposed on a non-adhesive side of the single-sided adhesive layer.

5. The method of claim 1, wherein the double-sided adhesive layer is disposed at all or a part of the peripheral region of the support substrate when disposing the double-sided adhesive layer.

6. The method of claim 5, wherein holes configured for adsorbing the flexible layer are disposed on a non-adhesive side of the single-sided adhesive layer.

7. The method of claim 1, wherein the cutting step comprises cutting to the surface of the single-sided adhesive layer when cutting the flexible layer.

8. The method of claim 1, wherein holes configured for adsorbing the flexible layer are disposed on a non-adhesive side of the single-sided adhesive layer.

9. The method of claim 8, wherein a diameter of the holes ranges from 1 micrometer to 100 micrometers.

10. The method of claim 1, wherein a thickness of the double-sided adhesive layer is the same as that of the single-sided adhesive layer.

11. A flexible substrate prefabricated component, comprising a flexible substrate, wherein the flexible substrate comprises an electronic device and a flexible layer provided with the electronic device; the flexible substrate prefabricated component further comprising a support substrate, a double-sided adhesive layer and a single-sided adhesive layer, wherein:
   the single-sided adhesive layer is disposed at a central portion of a surface of the support substrate, the double-sided adhesive layer are disposed at a peripheral region of the support substrate; the flexible layer is disposed on surfaces of the single-sided adhesive layer and the double-sided adhesive layer, the flexible layer is bonded to the double-sided adhesive layer, and the electronic device is disposed in a region of the single-sided adhesive layer;
   wherein the single-sided adhesive layer is in contact with and shape-match with the double-sided adhesive layer.

12. The flexible substrate prefabricated component of claim 11, wherein the single-sided adhesive layer, the double-sided adhesive layer and the flexible layer are disposed by way of coating or bonding.

13. The flexible substrate prefabricated component of claim 12, wherein the double-sided adhesive layer are disposed at all or a part of the peripheral region of the support substrate.

14. The flexible substrate prefabricated component of claim 12, wherein holes configured for adsorbing the flexible layer are disposed on a non-adhesive side of the single-sided adhesive layer.

15. The flexible substrate prefabricated component of claim 11, wherein the double-sided adhesive layer are disposed at all or a part of the peripheral region of the support substrate.

16. The flexible substrate prefabricated component of claim 11, wherein holes configured for adsorbing the flexible layer are disposed on a non-adhesive side of the single-sided adhesive layer.

17. The flexible substrate prefabricated component of claim 16, wherein a diameter of the holes ranges from 1 micrometer to 100 micrometers.

18. The flexible substrate prefabricated component of claim 11, wherein a thickness of the double-sided adhesive layer is the same as that of the single-sided adhesive layer.

* * * * *